(12) United States Patent
Aikawa et al.

(10) Patent No.: US 6,946,979 B1
(45) Date of Patent: Sep. 20, 2005

(54) ENCODER HAVING ELECTRODE PATTERN WITH PAIRS OF NON-CONDUCTIVE PORTIONS AND MULTIPLE SLIDERS THAT CONTACT THE ELECTRODE PATTERN

(75) Inventors: Kazuo Aikawa, Carmel, IN (US); Hideyasu Hayashi, Miyagi-pref. (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/883,002

(22) Filed: Jul. 1, 2004

(51) Int. Cl.[7] .................................................. H03M 1/22
(52) U.S. Cl. ....................................................... 341/10
(58) Field of Search ............................... 341/10, 11, 15, 341/2, 16, 78; 250/231.14; 310/323.08

(56) References Cited

U.S. PATENT DOCUMENTS

| | | | | |
|---|---|---|---|---|
| 3,152,324 A | * | 10/1964 | Webb | 341/11 |
| 3,188,627 A | * | 6/1965 | Webb et al. | 341/15 |
| 3,202,982 A | * | 8/1965 | Whitney | 341/78 |
| 3,206,738 A | * | 9/1965 | Wayman | 341/15 |
| 3,213,443 A | * | 10/1965 | Lancaster et al. | 341/11 |
| 3,449,588 A | * | 6/1969 | Foskett | 250/231.14 |
| 4,899,145 A | * | 2/1990 | Okuda et al. | 341/15 |
| 4,949,087 A | * | 8/1990 | Miyazawa | 341/16 |
| 5,237,237 A | * | 8/1993 | Ueda et al. | 310/323.08 |

FOREIGN PATENT DOCUMENTS

JP          2506877          4/1996

* cited by examiner

*Primary Examiner*—Jean Bruner Jeanglaude
(74) *Attorney, Agent, or Firm*—Brinks Hofer Gilson & Lione

(57) ABSTRACT

An encoder includes a rotary member having a predetermined electrode pattern and a fixed member having multiple channel contacts which are opposed to the electrode. The rotary member has stable reference phases where at most one pair of the contacts is ON (in electrical contact) and at least another pair is OFF (not in electrical contact), i.e. both pairs may be OFF. When the rotary member is rotated clockwise or counter-clockwise from one reference phase, both pairs of contacts are temporarily on before reaching the adjacent reference phase. The pairs of contacts that are ON or OFF at the adjacent reference phase differ dependent on the direction of rotation. A counter is incremented or decremented according to the direction of rotation.

19 Claims, 6 Drawing Sheets

(CK4)

(CK5)

(CK3, CK6)

ENCODER HAVING ELECTRODE PATTERN WITH PAIRS OF NON-CONDUCTIVE PORTIONS AND MULTIPLE SLIDERS THAT CONTACT THE ELECTRODE PATTERN

BACKGROUND OF THE INVENTION

1. Field of the Invention

The present invention relates to an encoder in which, as a rotary member is rotated, the states between different combinations of channels switch between a conductive state and a nonconductive state. More particularly, the present invention relates to an encoder in which a pattern of electrode can be easily formed for multiple channels, even if the size of the decoder is decreased.

2. Description of the Related Art

FIG. 7 is an explanatory drawing showing a summary of a construction of a conventional rotary encoder, and FIG. 8 shows wave-form charts (A) and (B) of output from the encoder. For example, an encoder of this kind is disclosed in Japanese Patent No. 2506877.

Conductive sliders 102, 103 and 104 are provided opposite a surface of a disk-shaped substrate 100. On the surface of the substrate 100, a disk-shaped electrode 105, which is formed of a conductive material such as gold, silver and copper, is disposed. The sliders 102, 103 and 104 come into contact with the electrode 105 at three different positions aligned radially with the substrate 100.

In the electrode 105, an inner peripheral region 106 with which the G-channel slider 102 as a common slider comes into contact is formed continuously all round (i.e. 0°-360°) in a rotating direction. An intermediate region 107 with which the H-channel slider 103 comes into contact is formed such that conductive portions 107a and nonconductive portions 107b alternate with each other in the rotating direction. Likewise, an outer peripheral region 108 with which the I-channel slider 104 comes into contact is formed such that conductive portions 108a and nonconductive portions 108b alternate with each other in the rotating direction. The conductive portions 107a and nonconductive portions 107b in the intermediate region 107 are offset by only a slight angle in the rotating direction from the conductive portions 108a and nonconductive portions 108b in the outer peripheral region 108.

The nonconductive portions 107b and 108b are formed by removing part of the electrode 105 to expose a nonconductive surface of the substrate 100.

(A) of FIG. 8 shows a wave form for ON/OFF switching between the H-channel and the G-channel and a waveform for ON/OFF switching between the I-channel and the G-channel when the substrate 100 is rotated in a CW (clockwise) direction relative to the sliders 102, 103 and 104. On the other hand, (B) of FIG. 8 shows a waveform for ON/OFF switching between the H-channel and G-channel and a waveform for ON/OFF switching between the I-channel and G-channel when the substrate 100 is rotated in a CCW (counterclockwise) direction relative to the sliders 102, 103 and 104.

As the substrate 100 is rotated, the state between the H-channel and the G-channel switches between ON and OFF. When the state between the H-channel and the G-channel switches from OFF to ON and back to OFF, the value of count information in a detection circuit is incremented by "1" (in the CW direction) or decremented by "1" (in the CCW direction).

Moreover, since a phase shift Tδ is provided between ON/OFF cycle between the H-channel and the G-channel and ON/OFF cycle between I-channel and the G-channel, the rotating direction of the substrate 100 can be identified. If the state between the H-channel and the G-channel is switched to ON but the state between the I-channel and the G-channel remains unchanged from OFF after the state between the H-channel and the G-channel and the state between the I-channel and the G-channel are both OFF, the rotating direction is CW; if the state between the H-channel and the G-channel remains unchanged from OFF but the state between the I-channel and the G-channel is switched to ON after the state between the H-channel and the G-channel and the state between the I-channel and the G-channel are both OFF, the rotating direction is CCW.

In an encoder of this kind, furthermore, a click mechanism is provided between the substrate 100 and a housing (not shown). For example, an outer peripheral surface of the substrate 100 is repeatedly recessed in the rotating direction and the housing is provided with a plate spring (not shown) for fitting in the recesses. Accordingly, the position of the substrate 100 can be stabilized each time the substrate 100 is rotated by a predetermined angle.

In the invention disclosed in Japanese Patent No. 2506877, the substrate 100 is stabilized when the H-channel slider 103 comes into contact with the nonconductive portion 107b and the I-channel slider 104 comes into contact with the nonconductive portion 108b, i.e., at respective phases CKa, CKb, CKc, etc., as shown in FIG. 8. Japanese Patent No. 2506877 discloses that since the H-channel slider 103 and the I-channel slider 104 are electrically disconnected from each other when the substrate 100 is stabilized, malfunctioning of the circuit can be prevented.

In the conventional encoder shown in FIGS. 7 and 8, the state between the H-channel and the G-channel switches from OFF to ON and back to OFF during rotation for one click angle due to the click mechanism, e.g., during rotation from the stable position CKa to the stable position CKb, and the value of count information in the detection circuit is incremented or decremented by "1" at each rotation for one click operation. That is, one conductive portion 107a and one nonconductive portion 107b for one cycle portion are present within a rotation angle θ for one count up or one count down; one conductive portion 108a and one nonconductive portion 108b for one cycle portion are also present within the rotation angle θ.

Accordingly, if the diameter of the substrate 100 is decreased to reduce the size of the encoder, the area of the substrate 100 within the angle θ is decreased by a substantial amount. This means that one conductive portion 107a and one nonconductive portion 107b for one cycle portion and one conductive portion 108a and one nonconductive portion 108b for one cycle portion need be disposed within this small area. This increases the precision necessary when creating the pattern of the electrode 105, which results in increasing the manufacturing cost and requires an exacting production process such as precision etching or laser processing.

In the conventional encoder, moreover, since the rotating direction is identified with the phase shift Tδ provided between ON/OFF cycle between the H-channel and the G-channel and ON/OFF cycle between I-channel and the G-channel, such a phase shift Tδ need be less than ½ (about ¼) of the ON/OFF cycle. If the substrate 100 is small (for example, the diameter of the encoder is at most about 10 mm), the displacement between the conductive portions 107a and 108a that provides the phase shift Tδ becomes extremely small, so that the rotating direction tends to be erroneously detected if the contact positions of the sliders 103 and 104 (which contact the conductive portions) are slightly displaced.

SUMMARY OF THE INVENTION

Accordingly, one embodiment of the present invention provides an encoder which enables detection of high accuracy even if an electrode pattern is relatively roughly formed within a rotation angle used for incrementing or decrementing and which is suitable for miniaturization.

According to one aspect of the present encoder contains a fixed member, a rotary member, and a click mechanism for stabilizing the rotary member at each rotation over a predetermined click angle. The fixed member or the rotary member has an electrode containing a predetermined pattern. The other of the fixed and rotary members has A-channel, B-channel and C-channel contacts which oppose the electrode. As the rotary member is rotated, a state between the A-channel and the C-channel and a state between the B-channel and the C-channel switch between a first state and a second state according to contact/noncontact between the respective contacts and the electrode. One of the first and second states is a conductive state and the other is a nonconductive state. If a phase where the state between the A-channel and the C-channel is in the first state and the state between the B-channel and the C-channel is in the second state while the rotary member is stabilized by the click mechanism, is taken as a reference phase: when the rotary member is stabilized after rotation for the click angle in one direction from the reference phase, the state between the A-channel and the C-channel is in the second state and the state between the B-channel and the C-channel is in the first state, and when the rotary member is stabilized after rotation for the click angle in an opposite direction from the reference phase, both the state between the A-channel and the C-channel and the state between the B-channel and the C-channel are in the first state.

In another aspect of the encoder, the pattern is arranged such that: at most one pair of the contacts is in electrical contact and at least another pair of the contacts is not in electrical contact at each reference point, and when the rotary member is rotated from one reference point to an adjacent reference point in which an electrical connection between at least a first pair of the pairs of contacts is different from the electrical connection between the first pair at the one reference point, both pairs of contacts are in electrical contact before reaching the adjacent reference point, and the electrical connection at the adjacent reference point differs dependent on a direction of rotation.

In another aspect of the encoder, the electrode is formed in a ring having an inner ring region and an outer ring region, the inner ring region contains conductive regions separated by first non-conductive regions, the outer ring region contains conductive regions separated by second and third non-conductive regions, centers of corresponding first and second non-conductive regions are aligned along same radii of the ring with the first non-conductive regions extending farther on both sides of the centers than the second non-conductive regions.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment according to the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

Figure 1:
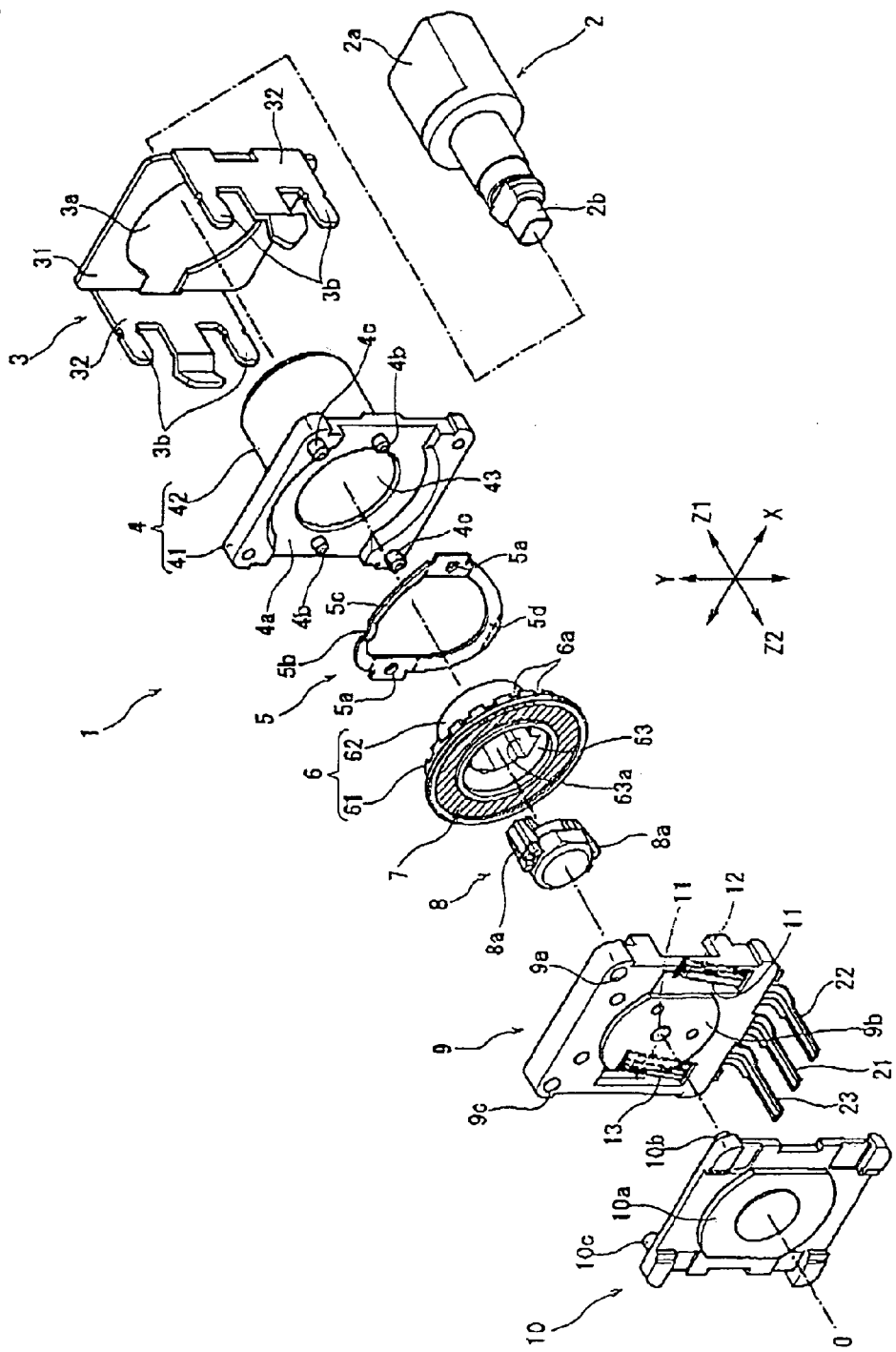
FIG. 1 is an exploded perspective view of an encoder according to one embodiment of the present invention.
Figure 2:
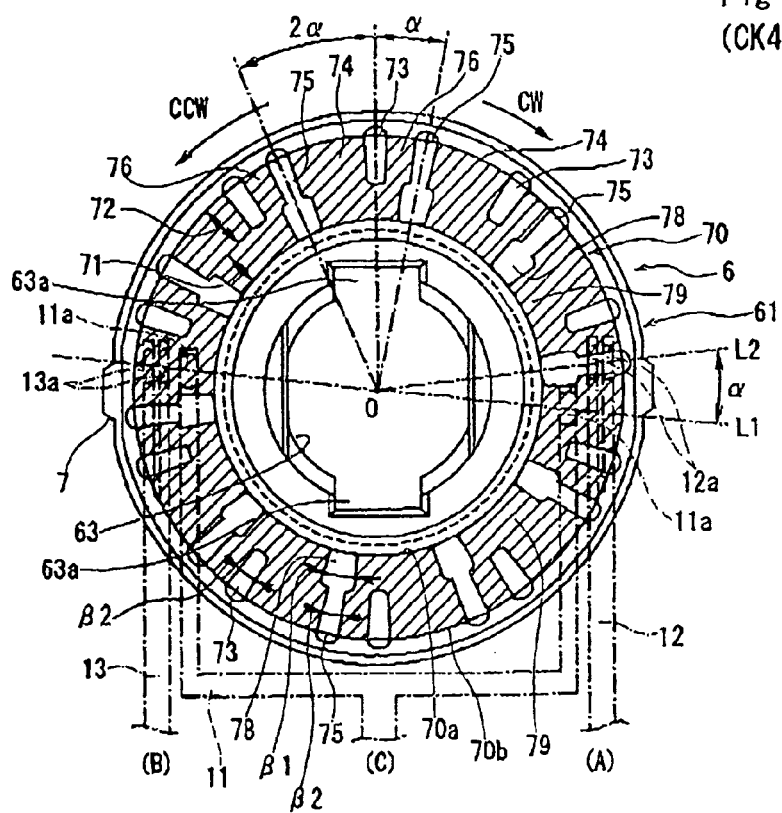
FIG. 2 is a front view showing relative positions between a substrate and sliders for describing operation of the encoder.
Figure 3:
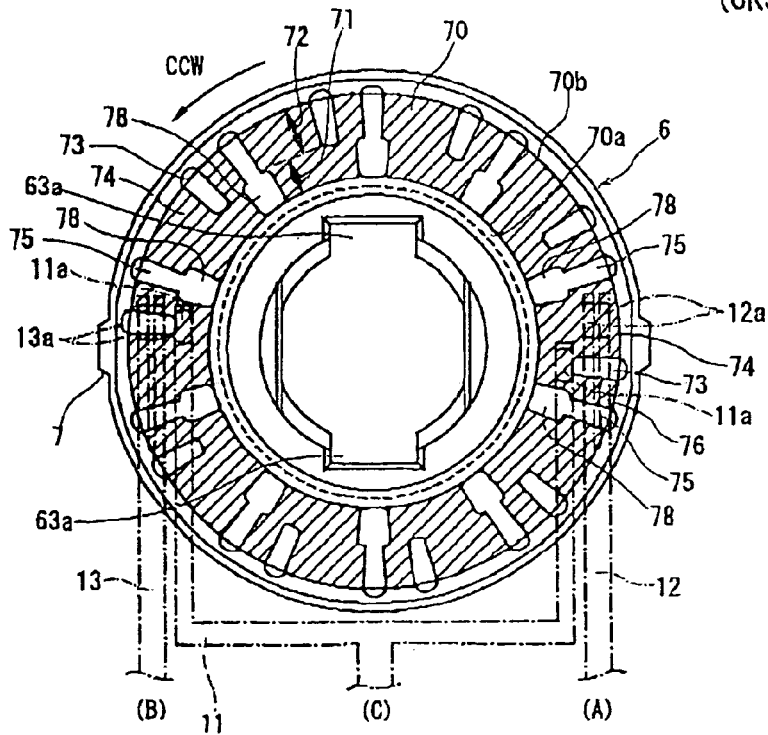
FIG. 3 is a front view showing a state where a rotary member is rotated by a predetermined angle in a CCW direction from the position of FIG. 2.
Figure 4:
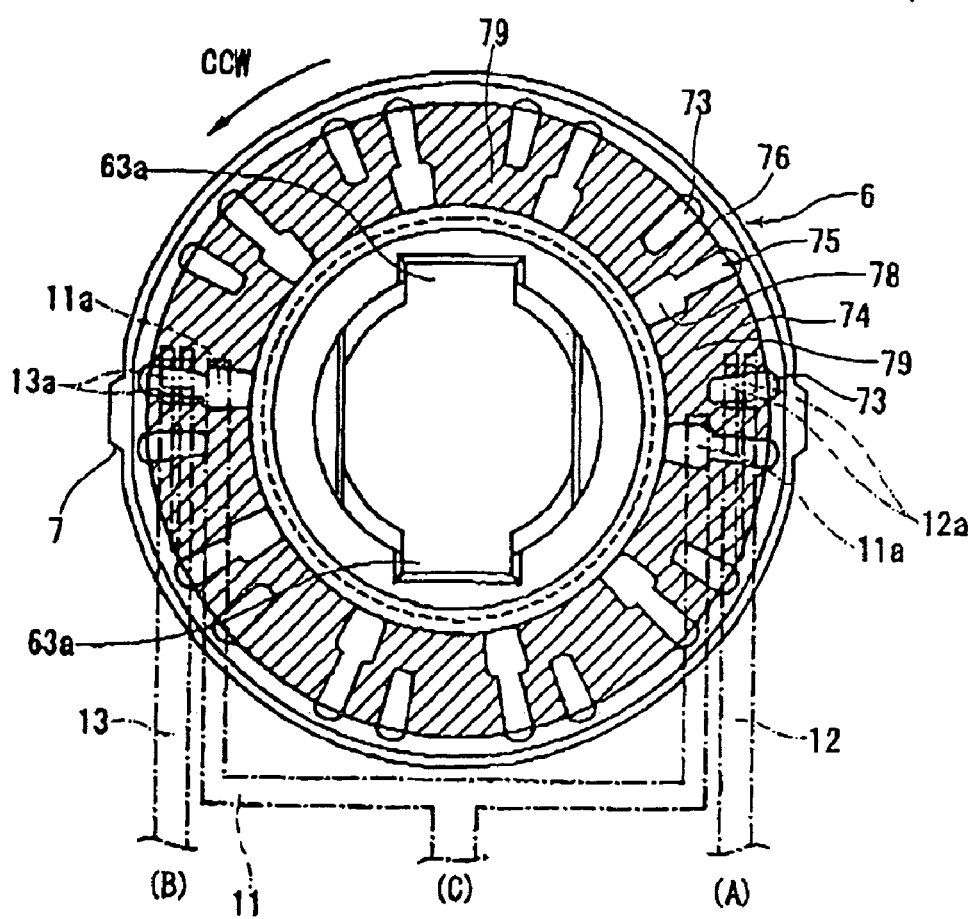
FIG. 4 is a front view showing a state where a rotary member is further rotated by a predetermined angle in a CCW direction from the position of FIG. 3.
Figure 5:
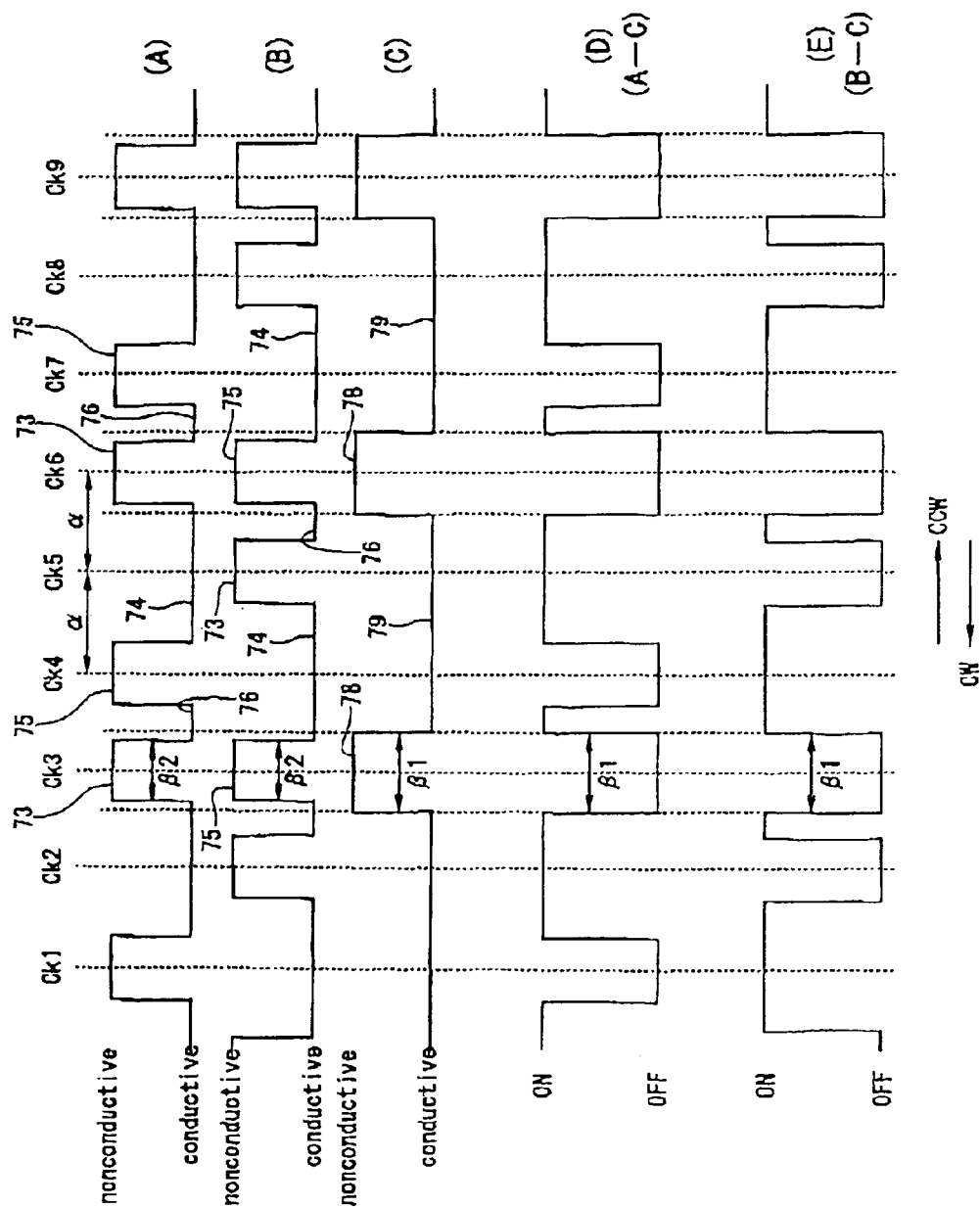
FIG. 5 is a timing diagram illustrating the operation of the encoder.
Figure 6:
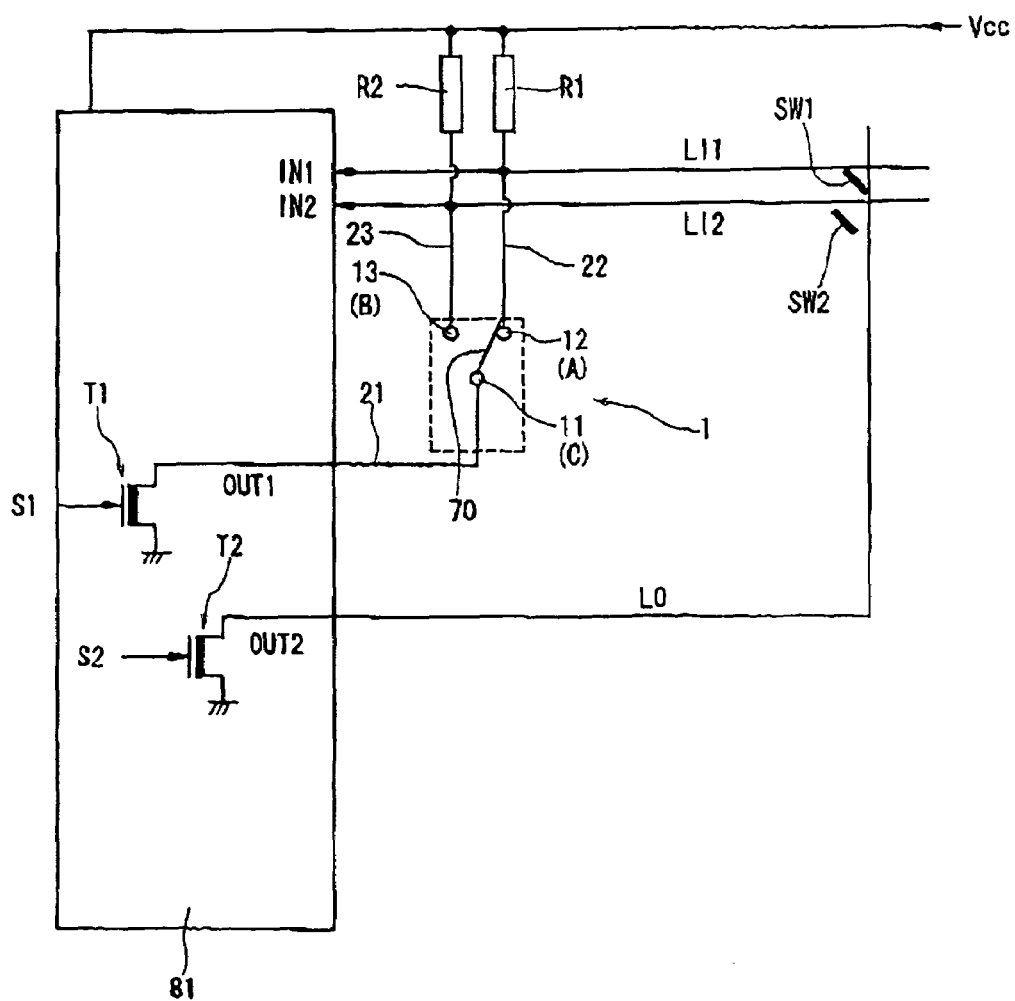
FIG. 6 is a block diagram of a circuit with the encoder.
Figure 7:
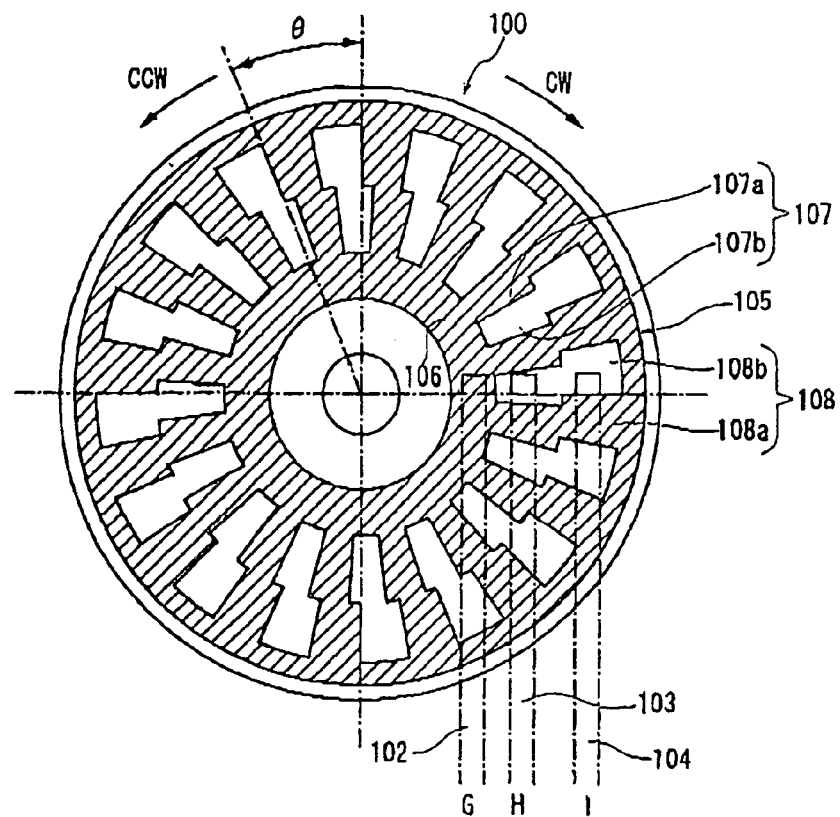
FIG. 7 is a front view showing a relationship between a substrate and sliders in a conventional encoder.
Figure 8:
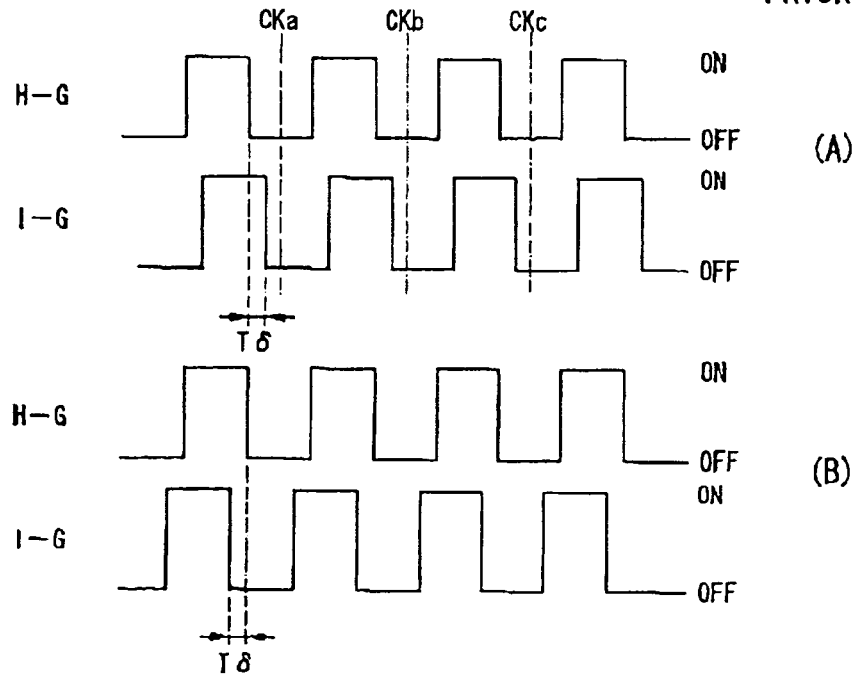
FIG. 8 shows wave-form charts of output from the encoder of FIG. 7.

FIG. 1 is an exploded perspective view of an encoder according to one embodiment of the present invention; FIGS. 2 to 4 are front views showing relative positions between a substrate and sliders for describing operation of the encoder; FIG. 5 is a timing diagram illustrating the operation of the encoder; and FIG. 6 is a block diagram of a detection circuit.

As shown in FIG. 1, an encoder 1 comprises an operating shaft 2, a fixing bracket 3, an upper housing 4, a plate spring 5, a rotary member 6, an electrode substrate 7, a fixing member 8, a lower housing 9, and a support member 10.

At one end of the operating shaft 2, part of a cylindrical body is cut away to form a fitting portion 2a. Also at the other end of the operating shaft 2, part of a cylindrical body is cut away to form a fitting portion 2b. The fitting portion 2a is fitted into an operating member (not shown) so that the operating shaft 2 can be turned through the operating member. On the other hand, the fitting portion 2b is fitted into and secured to the fixing member 8.

The fixing bracket 3, which is stamped out of a metallic plate and then pressed, comprises a cover portion 31 and side plates 32 and 32 bent from the cover portion 31 in Z2-direction. The cover portion 31 is formed with a circular opening 3a. Each side plate 32 is formed with a pair of holding pieces 3b and 3b.

The upper housing 4, which is formed of a synthetic resin, comprises a square lower base portion 41 and a cylindrical bushing 42. At its lower side, the lower base portion 41 is recessed to have a circular holding recess 4a, and retaining projections 4b and 4b, which are spaced apart from each other in X-direction, are integrally formed on the bottom surface of the holding recess 4a.

The plate spring 5, which constitutes a part of click mechanism, is formed of a metallic plate into the shape of a ring. The click mechanism in this invention need not be attended with the generation of the sound. That is, when the rotary member is rotated, it only has to be that the rotation is attended with the change of feeling, and the rotary member is supported stably at a predetermined angle (or position). The plate spring 5 is formed with retaining holes 5a and 5a. With the retaining projections 4b and 4b fitted into the retaining holes 5a and 5a, the plate spring 5 is positioned and secured to the bottom surface of the holding recess 4a formed in the upper housing 4. In the plate spring 5, portions on both sides of a line connecting the retaining holes 5a and 5a are curved to project in the Z2-direction, forming curved portions 5c and 5d. The curved portion 5c is formed at its top with a click fitting portion 5b which is raised in the Z2-direction.

The rotary member 6 comprises a disk-shaped flange portion 61 and a cylindrical portion 62 which is integrally formed to project from the flange portion 61 in Z1-direction, and is formed with a central hole 63 which passes through both the flange portion 61 and the cylindrical portion 62. At its Z1-side surface, the flange portion 61 is formed with a plurality of radially extending recesses 6a. The recesses 6a are formed at a constant pitch circumferentially of the flange portion 61. The recesses 6a constitute the click mechanism together with the plate spring 5, and the pitch of the recesses 6a is a click angle.

The cylindrical portion 62 of the rotary member 6 is inserted with a minimum gap into a bushing hole 43 which is formed centrally of the bushing 42 of the upper housing 4, whereby the rotary member 6 is rotatably assembled to the upper housing 4 with rotation center at a central axis O. When the rotary member 6 is thus assembled to the upper housing 4, the curved portions 5c and 5d of the plate spring 5 are elastically pressed against the flange portion 61 of the rotary member 6 and the click fitting portion 5b formed in the curved portion 5c is permitted to fit in the recesses 6a.

The operating shaft 2 and the operating member can generate a click feeling each time the recess 6a passes over the click fitting portion 5b during rotation of the rotary member 6. When a rotational operating force exerted on the operating member is eliminated, the click fitting portion 5b fitting in any one of the recesses 6a stabilizes the rotary member 6 so as not to cause unexpected rotation.

The electrode substrate 7 is secured to the Z2-side surface of the flange portion 61 of the rotary member 6. On the surface of the electrode substrate 7, an electrode has a predetermined pattern, as will be described later.

On the outer peripheral surface of the fixing member 8, a pair of fitting portions 8a and 8a is integrally formed to project in Y-direction. The fixing member 8 is inserted into the central hole 63 of the rotary member 6, and at this time, the fitting portions 8a and 8a are fitted in grooves 63a and 63a formed in the wall defining the central hole 63. Thus, the fixing member 8 assembled to the rotary member 6 is prevented from rotating. When the operating shaft 2 is inserted into the upper housing 4 in the Z2-direction after the plate spring 5 and the rotary member 6 are assembled to the upper housing 4, the fitting portion 2b of the operating shaft 2 unrotatably fits in a hole formed in the fixing member 8. As a result, the operating shaft 2, the rotary member 6 and the fixing member 8 are so supported by the upper housing 4 as to be integrally rotatable.

The lower housing 9 is formed of a synthetic resin and has a square shape which is substantially the same as that of the lower base portion 41 of the upper housing 4. The lower housing 9 is formed with two positioning holes 9a opening in the Z1-direction, one of which passes through the lower housing 9. Two positioning projections 4c projecting from the lower base portion 41 fit into the positioning holes 9a. Thus, the lower base portion 41 of the upper housing 4 and the lower housing 9 are assembled while housing the plate spring 5, the rotary member 6 and the fixing member 8.

Sliders 11, 12 and 13 are secured to the lower housing 9. Base portions of the sliders 11, 12 and 13 are embedded in the lower housing 9 by insert molding. The sliders 11, 12 and 13 are formed by plating an elastically deformable plate spring material with a conductive material such as gold. With the lower housing 9 assembled to the lower base portion 41, the individual sliders 11, 12 and 13 are elastically pressed against the electrode substrate 7.

External leading-out terminals 21, 22 and 23 are secured to the lower housing 9 by insert molding. The external leading-out terminal 21 is connected to the slider 11, the external leading-out terminal 22 is connected to the slider 12, and the external leading-out terminal 23 is connected to the slider 13.

A raised portion 9b is formed integrally centrally on the Z2-side surface of the lower housing 9. The lower housing 9 is assembled to the support member 10 by fitting the raised portion 9b into a fitting portion 10a of the support member 10. Furthermore, two positioning pins 10b and 10c provided on the support member 10 are fitted into positioning holes 9a and 9c formed in the lower housing 9, thereby positioning the lower housing 9 with respect to the support member 10.

After the operating shaft 2, the upper housing 4, the plate spring 5, the rotary member 6, the fixing member 8, the lower housing 9 and the support member 10 are assembled, the fixing bracket 3 is mounted. With the side plates 32 and 32 of the fixing bracket 3, side faces of the lower base portion 41, the lower housing 9 and the support member 10 are retained. By folding the individual holding pieces 3b upon the Z2-side surface of the support member 10, moreover, the components are secured to each other. When the assembly is completed, the operating shaft 2 projects forwardly through the opening 3a of the fixing bracket 3.

FIGS. 2 to 4 show how an electrode 70, which is formed in a predetermined pattern on the surface of the electrode substrate 7, is confronted by the individual sliders 11, 12 and 13. The slider 11 is the C-channel, the slider 12 is the A-channel, and the slider 13 is the B-channel.

The C-channel slider 11 has two sliding portions 11a and 11a, whose central portions come into contact with the substrate 7. The sliding portions 11a and 11a are diametrically disposed about the central axis O, i.e., located on a straight line L1 passing through the central axis O. It should be noted that the sliding portions 11a and 11a are opposed to the same phase in the periodic pattern of the electrode 70.

The B-channel slider 13 has two sliding portions 13a and 13a. Central portions of the sliding portions 13a and 13a also come into contact with the substrate 7. The sliding portions 13a and 13a are in contact with the electrode 70 at the same phase as the sliding portions 11a and 11a of the C-channel slider 11.

The A-channel slider 12 also has two sliding portions 12a and 12a, whose central portions come into contact with the substrate 7. The phase where the sliding portions 12a and 12a are in contact with the electrode 70 is shifted by an angle α in the rotating direction from the phase where the sliding portions 13a and 13a are in contact with the electrode 70.

More specifically, the central portions of the sliding portions 12a and 12a are located on a straight line L2 which makes the angle α with the straight line L1.

In the encoder 1, as has been described hereinbefore, the click fitting portion 5b formed in the plate spring 5 and the plural recesses 6a formed in the rotary member 6 constitute the click mechanism. Also, the pitch of the recesses 6a is a click angle and the rotary member 6 is stabilized at each rotation for the click angle. In this embodiment, the angle α is equal to the click angle.

The electrode 70 is formed on the substrate 7. More specifically, the electrode 70 is formed from a conductive material such as gold, silver and copper and is applied to the surface of the substrate 7 in a predetermined pattern by a method such as screen printing.

The electrode 70 is in the shape of a ring having an inner peripheral edge 70a and an outer peripheral edge 70b. An inner ring region 71 having a predetermined width from the inner peripheral edge 70a toward the outer periphery is the region on which the C-channel slider 11 is permitted to slide. An outer ring region 72 having a predetermined width outside the inner ring region 71 is the region on which both the A-channel slider 12 and the B-channel slider 13 are permitted to slide.

In this embodiment, since both the A-channel slider 12 and the B-channel slider 13 are permitted to slide on the common outer ring region 72 and an angular deviation (phase shift α) exists between the position where the sliding portions 12a of the A-channel slider 12 come into contact with the outer ring region 72 and the position where the sliding portions 13a of the B-channel slider 13 come into contact with the outer ring region 72, the output can be provided separately for the A-channel and the B-channel even if the width of the outer ring region 72 is quite small. Accordingly, the pattern of the electrode 70 can be easily formed even if the substrate 7 has an extremely small diameter.

The pattern of the electrode 70 is shown in FIGS. 2, 3 and 4. In these figures, the hatched portions are conductive portions in which a conductive material is present, while the unhatched portions are nonconductive portions where the surface of the substrate 7 is exposed. The surface of the substrate 7 is nonconductive, whether or not the remainder of the substrate 7 is formed from a non-conductive material.

In the outer ring region 72, first nonconductive portions 73 and second nonconductive portions 75 are separated by first conductive portions 74 and second conductive portions 76. The first nonconductive portions 73 are regularly spaced apart from each other by an angle (3×α). Similarly, the second nonconductive portions 75 are also regularly spaced apart from each other by the angle (3×α). In the counterclockwise (CCW) direction, the first conductive portions 74 are next to the first nonconductive portions 73, and second nonconductive portions 75 are next to the first conductive portions 74. The first nonconductive portions 73 and the second nonconductive portions 75 are arranged at an angular interval (2×α) with the first conductive portions 74 disposed therebetween. In the clockwise (CW) direction, second conductive portions 76 are next to the first nonconductive portions 73, and the second nonconductive portions 75 are next to the second conductive portions 76. The first nonconductive portions 73 and the second nonconductive portions 75 are arranged at an angular interval α with the second conductive portions 76 disposed therebetween. In the outer ring region 72, therefore, the first and second nonconductive portions 73 and 75 are repeated in the CCW direction such that if one of the first nonconductive portions 73 is taken as a reference point, a second nonconductive portion 75 is separated from that first nonconductive portion 73 by the angle (2×α) and another first nonconductive portion 73 as a next reference point is separated from that second nonconductive portion 75 by the angle α.

In the inner ring region 71, nonconductive portions 78 and conductive portions 79 alternate with each other in the rotating direction. The angular interval between adjacent nonconductive portions 78 is (3×α).

The nonconductive portions 78 in the inner ring region 71 and the second nonconductive portions 75 in the outer ring region 72 are arranged at the same angular positions so that each nonconductive portion 78 is continuous with a corresponding nonconductive portion 75. In this embodiment, the center angle β1 of the nonconductive portion 78 is larger than the center angle β2 of the second nonconductive portion 75, and the range of the angle β2 is included in the range of the angle β1 (i.e. the nonconductive portions 78 are wider than the second nonconductive portions 75). Accordingly, whether the rotary member 6 rotates in the CW direction or in the CCW direction, the nonconductive portions 78 always precede the second nonconductive portions 75. The first nonconductive portion 73 has the same center angle β2 as the second nonconductive portion 75 (i.e. the first nonconductive portions 73 and the second nonconductive portions 75 have the same width).

Next, the operation of the encoder 1 will be described.

In FIG. 5, the operation progress when the rotary member 6 is rotated in the CCW direction is shown progressing from left to right, while the operation progress when the rotary member 6 is rotated in the CW direction is shown progressing from right to left.

In FIG. 5, rotational phases where the rotary member 6 is stabilized by the click mechanism are indicated by CK1, CK2, and so on. FIG. 2 shows a state where the rotary member 6 is stabilized at a phase CK4, FIG. 3 shows a state where the rotary member 6 is stabilized at a phase CK5, and FIG. 4 shows a state where the rotary member 6 is stabilized at a phase CK6 (CK3). In this embodiment, the phase CK4 at which the rotary member 6 is stabilized as shown in FIG. 2 is called reference phase, to specify a standard position of the operation.

(A) of FIG. 5 shows contact positions between the sliding portions 12a of the A-channel slider 12 and the substrate 7. At the reference phase CK4, the sliding portions 12a are in contact with the second nonconductive portion 75 (see FIG. 2). At the phase CK5, the sliding portions 12a are in contact with the first conductive portion 74 (see FIG. 3). At the phase CK6 (CK3), the sliding portions 12a are in contact with the first nonconductive portion 73 (see FIG. 4).

(B) of FIG. 5 shows contact positions between the sliding portions 13a of the B-channel slider 13 and the substrate 7. At the reference phase CK4, the sliding portions 13a are in contact with the first conductive portion 74 (see FIG. 2). At the phase CK5, the sliding portions 13a are in contact with the first nonconductive portion 73 (see FIG. 3). At the phase CK6 (CK3), the sliding portions 13a are in contact with the second nonconductive portion 75 (see FIG. 4).

(C) of FIG. 5 shows contact positions between the sliding portions 11a of the C-channel slider 11 and the substrate 7. At the reference phase CK4 and the next phase CK5, the sliding portions 11a are in contact with the conductive portion 79 (see FIGS. 2 and 3). At the phase CK6 (CK3), the sliding portions 11a are in contact with the nonconductive portion 78 (see FIG. 4).

(D) of FIG. 5 shows a state between the A-channel (slider 12) and the C-channel (slider 11) which switches between the conductive state (ON) and the nonconductive state (OFF). On the other hand, (E) of FIG. 5 shows a state between the B-channel (slider 13) and the C-channel (slider 11) which switches between the conductive state (ON) and the nonconductive state (OFF). Hereinafter, the state between the A-channel and the C-channel is abbreviated "A–C state" and the state between B-channel and the C-channel is abbreviated "B–C state." In this embodiment, OFF is the first state and ON is the second state for both the A–C state and the B–C state. It is also possible, however, that ON is the first state and OFF is the second state.

At the reference phase CK4, the A–C state is OFF, as shown in (D) of FIG. 5, while the B–C state is ON, as shown in (E) of FIG. 5. As the rotary member 6 is rotated in the CCW direction from the phase CK4, the A–C state is switched to ON so that both the A–C state and the B–C state are ON, and then, the B–C state is switched to OFF so that the A–C state is ON while the B–C state is OFF at the phase CK5 where the rotary member 6 is stabilized as shown in FIG. 3.

As the rotary member 6 is rotated in the CW direction from the reference phase CK4, on the other hand, the A–C state is switched to ON so that both the A–C state and the B–C state are ON, and then, both the A–C state and the B–C state are switched to OFF for the phase CK3 where the rotary member 6 is stabilized.

Accordingly, if only the B–C state is switched to OFF after both the A–C state and the B–C state are temporarily ON during rotation from the reference phase CK4, the rotating direction of the rotary member 6 is identified as CCW. On the contrary, if both the A–C state and the B–C state are switched to OFF after both the A–C state and the B–C state are temporarily ON during rotation from the reference phase CK4, the rotating direction is identified as CW.

In the case where the phase CK5 is taken as a reference: if both the A–C state and the B–C state are switched to OFF after both the A–C state and the B–C state are temporarily ON during rotation from the phase CK5, the rotating direction is identified as CCW; if only the A–C state is switched to OFF after both the A–C state and the B–C state are temporarily ON during rotation from the phase CK5, the rotating direction is identified as CW.

In the case where the phase CK6 is taken as a reference: if only the A–C state is switched to OFF after both the A–C state and the B–C state are temporarily ON during rotation from the phase CK6, the rotating direction is identified as CCW; if only the B–C state is switched to OFF after both the A–C state and the B–C state are temporarily ON during rotation from the phase CK6, the rotating direction is identified as CW.

In this embodiment, the timing for both the A–C state and the B–C state to switch to OFF at the phases CK3 and CK6 is determined by the center angle β 1 of the nonconductive portions 78 in the inner ring region 71. Since the center angle β 1 is larger than the center angle β 2 of the first nonconductive portions 73 and the center angle β 2 of the second nonconductive portions 75, the A–C state and the B–C state can be simultaneously switched to OFF by the nonconductive portions 78 without fail.

Therefore, when the rotary member 6 is rotated in the CW direction from the reference phase CK4, it will never happen that one of the B–C state and the A–C state is switched to OFF earlier than the other. Thus, the rotation in the CW direction from the reference phase CK4 can be certainly recognized.

By inputting ON/OFF of the A–C state shown in (D) of FIG. 5 and ON/OFF of the B–C state shown in (E) of FIG. 5 to the detection circuit of this embodiment, the rotating direction of the rotary member 6 is thus identified, and a counter is incremented or decremented according to the ON/OFF switching.

In the encoder 1, the counter is incremented or decremented by "1" at each rotation of the rotary member 6 for the click angle α. For example, when the rotary member 6 is rotated in the CCW direction, the counter is incremented by "1" at each rotation for the click angle α, while when the rotary member 6 is rotated in the CW direction, the counter is decremented by "1" at each rotation for the click angle α. Of course, the counter may be incremented or decremented by numbers other than "1" for each click angle α, in accordance with the detection circuit.

When the detection circuit recognizes that only the B–C state is switched from ON to OFF after both the A–C state and the B–C state are temporarily ON during rotation of the rotary member 6 in the CCW direction from the reference phase CK4 to the phase CK5, the counter is incremented by "1" at the time of such ON/OFF switching.

When it is recognized that both the A–C state and the B–C state are switched from ON to OFF after both the A–C state and the B–C state are temporarily ON during rotation of the rotary member 6 in the CW direction from the reference phase CK4 to the phase CK3, the counter is decremented by "1" at the time of such ON/OFF switching.

This is also applicable when the phase CK5 or CK3 is taken as a reference, in which case both the A–C state and the B–C state are ON at some point before the rotary member 6 rotating in the CW or CCW direction is stabilized at the next stable position.

Thus, since both the output between the A-channel and the C-channel and the output between the B-channel and the C-channel are ON definitely occurs in the transition process from one stable position to the next stable position, malfunctioning of the counter due to chattering between the contacts and the electrode is minimized or eliminated. This enhances the reliability of the present encoder, compared with conventional encoders in which the counter is simply incremented or decremented according to ON/OFF switching.

In addition, since the detection circuit can prepare for incrementing and decrementing after detection of the situation where both the A–C state and the B–C state are ON, programming can be simplified when the detection circuit contains a microprocessor.

Although incrementing and decrementing can thus be carried out with high accuracy at each rotation over the angle α, the arrangement density of the nonconductive portions 73 and 75 and the conductive portions 74 and 76 in the outer ring region 72 of the electrode 70 is not very high. In neither the A–C state shown in (D) of FIG. 5 nor the B–C state shown in (E) of FIG. 5, is it necessary to rotate entirely through both ON and OFF over one cycle portion between adjacent stable positions (within the angle α).

That is, incrementing and decrementing at each rotation for the angle α can be definitively carried out in both the CCW direction and the CW direction even though the arrangement density of the conductive portions and the nonconductive portions in the outer ring region 72 is not very high, as shown in FIGS. 2 to 5. Moreover, the recognition of the rotating direction of the rotary member 6 is easier, compared with the conventional encoder in which phases of two outputs are slightly shifted. Therefore, the pattern of the electrode 70 can be easily formed even if the substrate 7 is small and has a diameter equal to or less than about 10 mm or 5 mm.

Thus, it is unnecessary for both the A–C state and the B–C state to be ON during rotation of the rotary member 6 in both the CW and CCW directions from the reference phase CK4. That is, the rotating direction for the click angle can be identified as long as only the B–C state is OFF at the phase CK5 while both the A–C state and the B–C state are OFF at the phases CK3 and CK6. However, if both the A–C state and the B–C state are ON during rotation from the reference phase CK4, the accuracy of detection of the rotating direction can be improved more, as set forth above.

In addition, it is not necessary to provide the nonconductive portions 78. Both the A–C state and the B–C state can be switched to OFF by bringing the A-channel slider 12 into contact with the first nonconductive portion 73 and bringing the B-channel slider 13 into contact with the second nonconductive portion 75 at the stable position (phases CK3, CK6 and so on) shown in FIG. 4. However, if the nonconductive portions 78 are provided, the A–C state and the B–C state can be simultaneously switched to OFF when the rotary member 6 reaches the phases CK3, CK6 and so on, thereby preventing an erroneous detection due to timing offset.

In the encoder 1, the A-channel slider 12 and the B-channel slider 13 are not electrically connected together at any stable positions of the rotary member 6. FIG. 6 shows a detection circuit configuration suitable for use with the encoder 1.

In the detection circuit of FIG. 6, a controller 81 is provided with output ports "OUT 1" and "OUT 2" and input ports "IN 1" and "IN 2".

The C-channel slider 11 of the encoder 1 is connected to the output port "OUT 1" via the external leading-out terminal 21. The A-channel slider 12 is connected to an input line LI1 for the input port "IN 1" via the external leading-out terminal 22, and also connected to a power supply voltage Vcc via a resistor R1. On the other hand, the B-channel slider 13 is connected to an input line LI2 for the input port "IN 2" via the external leading-out terminal 23, and also connected to the power supply voltage Vcc via a resistor R2.

In the circuit of FIG. 6, a switch SW1 for electrically connecting an output line L0 for the output port "OUT 2" to the input line LI1 for the input port "IN 1" and a switch SW2 for electrically connecting the output line L0 for the output port "OUT 2" to the input line LI2 for the input port "IN 2" are provided.

In the controller 81, an active element T1 such as a field-effect transistor (FET) permits grounding of the output port "OUT 1" using a switching signal S1 and an active element T2 such as a field-effect transistor (FET) permits grounding of the output port "OUT 2" using a switching signal S2. The switching signals S1 and S2 are alternately applied to the active elements T1 and T2 in a time-division manner for a predetermined period, whereby the output ports "OUT 1" and "OUT 2" are alternately grounded. As shown in (D) and (E) of FIG. 5, the period of time-division is sufficiently shorter than the period of ON/OFF switching of the A–C state and the period of ON/OFF switching of the B–C state which are performed by turning the operating shaft 2 so that the respective input to the controller 81 is stable. This permits the controller 81 to increment or decrement the count in a secure manner without having to worry about any problems due to transitions between the conductive and non-conductive states.

If the A–C state is switched to ON when the output port "OUT 1" is grounded, the input port "IN 1" is grounded and the input into the input port "IN 1" is "Low". If the A–C state is OFF when the output port "OUT 1" is grounded, no current flows into the resistor R1, and the input port "IN 1" has almost the same potential as the power supply voltage Vcc, resulting in the input into the input port "IN 1" being "High".

Likewise, when the output port "OUT 1" is grounded: if the B–C state is ON, the input into the input port "IN 2" is "Low"; if the B–C state is OFF, the input into the input port "IN 2" is "High".

A CPU provided in the controller 81 can identify the switching operation shown in (D) and (E) of FIG. 5 by detecting the change in voltage of the input ports "IN 1" and "IN 2" when the output port "OUT 1" is grounded, thereby incrementing or decrementing the count and identifying the rotating direction of the rotary member 6.

If the input line LI1 and the output line L0 are electrically connected together by the switch SW1 when the output port "OUT 2" is grounded, the input port "IN 1" is grounded and the input into the input port "IN 1" is "Low". If the input line LI1 and the output line L0 are not electrically connected together by the switch SW1 at this time, the input into the input port "IN 1" is "High". Also when the output port "OUT 2" is grounded: if the input line LI2 and the output line L0 are electrically connected together by the switch SW2, the input into the input port "IN 2" is "Low"; if the input line LI2 and the output line L0 are not electrically connected together, the input into the input port "IN 2" is "High". That is, when the output port "OUT 2" is grounded: if the input port "IN 1" is "Low", it is recognized that the switch SW1 is in operation; if the input port "IN 2" is "Low", it is recognized that the switch SW2 is in operation.

In this detection circuit, the input ports "IN 1" and "IN 2" of the controller 81 are used not only as input ports for the encoder 1 but also as input ports for the switches SW1 and SW2 so as to simplify the circuit.

If the A-channel slider 12 and the B-channel slider 13 were both in contact with the conductive portions of the electrode 70 and electrically connected together through the electrode 70 when the rotary member 6 of the encoder 1 is stabilized by the click mechanism, the input line LI1 for the input port "IN 1" and the input line LI2 for the input port "IN 2" would be electrically connected together all the time. If switch SW1 is then operated, both the input ports "IN 1" and "IN 2" would be "Low" when the output port "OUT 2" is grounded. Therefore, even though only switch SW1 is in operation, the controller 81 would erroneously recognize that both the switches SW1 and SW2 are simultaneously operated. In this construction, accordingly, diodes or the like can be provided in the external leading-out terminals 22 and 23 of the circuit for preventing back flow of the current, increasing the complexity of the circuit.

In the encoder 1 of the present embodiment, however, at least one of the A-channel slider 12 and the B-channel slider 13 definitely comes into contact with the nonconductive portion when the rotary member 6 is stabilized by the click mechanism, so that the A-channel slider 12 and the B-channel slider 13 will never be electrically connected together. Therefore, operation of only one of the switches SW1 and SW2 at the time when the rotary member 6 is stabilized by the click mechanism will never cause both the input into the input port "IN 1" and the input into the input port "IN 2" become "Low".

Although the present invention has been illustrated and described with respect to exemplary embodiment thereof, it should be understood by those skilled in the art that the foregoing and various other changes, omission and additions may be made therein and thereto, without departing from the spirit and scope of the present invention.

For example, an electrode may be disposed on the fixed member side while three contacts may be disposed on the rotary member side. In this construction, the electrode is divided into three patterns arranged at an angle of 120 degrees. One pattern may then be formed to alternate between conductive and nonconductive portions for obtaining an A-channel output and the remaining two patterns likewise formed for obtaining B-channel and C-channel outputs. The three contacts are connected together and are arranged to slide on different electrode patterns. In this case, the individual contacts function as A-channel contact, B-channel contact and C-channel contact in turn.

The present invention should not be understood as limited to the specific embodiment set out above but to include all possible embodiments which can be embodied within a scope encompassed and equivalent thereof with respect to the feature set out in the appended claims.

What is claimed is:

1. An encoder comprising:
   a fixed member;
   a rotary member; and
   a click mechanism for stabilizing the rotary member at predetermined click angles,
   wherein one of the fixed member and the rotary member has an electrode with a predetermined pattern, the other of the fixed member and the rotary member has A-channel, B-channel and C-channel contacts opposing the electrode such that as the rotary member is rotated, a state between the A-channel and the C-channel and a state between the B-channel and the C-channel switch between a first state and a second state according to contact/noncontact between the respective contacts and the electrode,
   one of the first state and the second state is a conductive state, and the other of the first state and the second state is a nonconductive state, wherein
   (a) if a phase where the state between the A-channel and the C-channel is in the first state and the state between the B-channel and the C-channel is in the second state while the rotary member is stabilized by the click mechanism, is taken as a reference phase,
   (b) when the rotary member is stabilized after rotation over one click angle in one direction from the reference phase, the state between the A-channel and the C-channel is in the second state and the state between the B-channel and the C-channel is in the first state, and
   (c) when the rotary member is stabilized after rotation for the click angle in an opposite direction from the reference phase, both the state between the A-channel and the C-channel and the state between the B-channel and the C-channel are in the first state.

2. An encoder according to claim 1, wherein both the state between the A-channel and the C-channel and the state between the B-channel and the C-channel are in the second state occurs both before (b) and before (c).

3. An encoder according to claim 1, wherein the A-channel contact and the B-channel contact move in a common sliding area of the electrode, and when the A-channel contact is opposed to an arbitrary phase in the electrode pattern, the B-channel contact is opposed to a different phase in the electrode pattern.

4. An encoder according to claim 1, wherein the first state is the nonconductive state and the second state is the conductive state.

5. An encoder according to claim 4, wherein in (c), the C-channel contact is electrically disconnected from the electrode such that both the state between the A-channel and the C-channel and the state between the B-channel and the C-channel are in the nonconductive state.

6. An encoder according to claim 4, wherein:
   both the state between the A-channel and the C-channel and the state between the B-channel and the C-channel are in the conductive state occurs before (c),
   in (c), at least the A-channel contact and the C-channel contact are electrically disconnected from the electrode, and
   an angle range of the rotary member where the A-channel contact is electrically disconnected from the electrode is included in an angle range of the rotary member where the C-channel contact is electrically disconnected from the electrode.

7. An encoder according to claim 3, wherein the click angle is equal to an angle between the phase to which the A-channel contact is opposed and the phase to which the B-channel contact is opposed.

8. An encoder according to claim 1, wherein an output obtained when the state between the A-channel and the C-channel is switched to the first state during rotation of the rotary member and an output obtained when the state between the B-channel and the C-channel is switched to the first state during rotation of the rotary member are both used for counting pulses.

9. An encoder comprising:
   a fixed member;
   a rotary member; and
   a click mechanism for stabilizing the rotary member at predetermined reference points,
   wherein one of the fixed member and the rotary member has an electrode with a predetermined pattern and the other of the fixed member and the rotary member has a plurality of channel contacts opposing the electrode,
   the pattern is arranged such that:
   at most one pair of the contacts is in electrical contact and at least another pair of the contacts is not in electrical contact at each reference point, and
   when the rotary member is rotated from one reference point to an adjacent reference point in which an electrical connection between at least a first pair of the pairs of contacts is different from the electrical connection between the first pair at the one reference point, both pairs of contacts are in electrical contact before reaching the adjacent reference point, and the electrical connection at the adjacent reference point differs dependent on a direction of rotation.

10. An encoder comprising:
    a fixed member;
    a rotary member; and
    a click mechanism for stabilizing the rotary member at predetermined angles,
    wherein one of the fixed member and the rotary member has an electrode with a predetermined pattern and the other of the fixed member and the rotary member has a plurality of channel contacts opposing the electrode,
    the electrode is formed in a ring having an inner ring region and an outer ring region, the inner ring region contains conductive regions separated by first nonconductive regions, the outer ring region contains conductive regions separated by second and third nonconductive regions, centers of corresponding first and second non-conductive regions are aligned along same radii of the ring with the first non-conductive regions extending farther on both sides of the centers than the second non-conductive regions.

11. An encoder according to claim 10, wherein:
a first contact splits into first contact portions and contacts opposite sides of the inner ring region at positions that are diametrically disposed about a central axis passing through a center of the ring such that the first contact portions both contact either the conductive regions on the inner ring region or the first non-conductive regions, and
second and third contacts contact opposite sides of the outer ring region such that one of the first contact portions and the second contact is aligned along the central axis and the other of the first contact portions and the third contact are aligned along different axes.

12. An encoder according to claim 11, wherein the second and third contacts are each split into a plurality of contact portions, the contact portions of the second contact disposed adjacent to each other and the contact portions of the third contact disposed adjacent to each other.

13. An encoder according to claim 10, wherein an angular separation between the centers of the first and second non-conductive regions is an integer multiple of a minimum angular separation between the centers of the second and third non-conductive regions.

14. An encoder according to claim 13, wherein angular separations between the centers of the second and third non-conductive regions are different in a clockwise direction than in a counterclockwise direction.

15. An encoder according to claim 14, wherein the angular separation between the centers of the second and third non-conductive regions in one of the clockwise and counterclockwise directions is an integer multiple of the angular separation between the centers of the second and third non-conductive regions in the other of the clockwise and counterclockwise directions.

16. An encoder according to claim 10, wherein the first, second, and third non-conductive regions are regularly spaced such that an angular separation between the centers of the first and second non-conductive regions and an angular separation between centers of the third non-conductive regions are equal.

17. An encoder according to claim 10, wherein widths of the inner and outer ring portions are substantially equal.

18. An encoder according to claim 10, wherein the first and second non-conductive regions extend symmetrically around the centers of the first and second non-conductive regions, and a distance of extension of the first non-conductive regions is substantially less than a distance between the second and third non-conductive regions.

19. An encoder according to claim 10, wherein a diameter of the rotary member is smaller than about 10 mm.

* * * * *